(12) United States Patent
Koshizawa

(10) Patent No.: US 11,638,377 B2
(45) Date of Patent: Apr. 25, 2023

(54) SELF-ALIGNED SELECT GATE CUT FOR 3D NAND

(71) Applicant: Applied Materials, Inc., Santa Clara, CA (US)

(72) Inventor: Takehito Koshizawa, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 207 days.

(21) Appl. No.: 17/019,334

(22) Filed: Sep. 13, 2020

(65) Prior Publication Data

US 2021/0082936 A1    Mar. 18, 2021

Related U.S. Application Data

(60) Provisional application No. 62/900,427, filed on Sep. 13, 2019.

(51) Int. Cl.
H01L 21/768    (2006.01)

(52) U.S. Cl.
CPC ....... *H10B 41/27* (2023.02); *H01L 21/76802* (2013.01); *H10B 43/27* (2023.02)

(58) Field of Classification Search
CPC ......... H01L 27/11556; H01L 27/11582; H01L 27/01568
See application file for complete search history.

(56) References Cited

U.S. PATENT DOCUMENTS

| | | |
|---|---|---|
| 9,960,045 B1 | 5/2018 | Purayath |
| 10,319,739 B2 | 6/2019 | Purayath |
| 10,325,923 B2 | 6/2019 | Purayath |
| 10,354,916 B2 | 6/2019 | Chen et al. |
| 10,410,869 B2 | 9/2019 | Roy et al. |
| 10,468,259 B2 | 11/2019 | Purayath et al. |
| 10,529,737 B2 | 1/2020 | Purayath |
| 10,541,246 B2 | 1/2020 | Purayath |
| 10,553,604 B2 | 2/2020 | Lu et al. |
| 10,622,251 B2 | 4/2020 | Chen et al. |
| 10,790,298 B2 | 9/2020 | Purayath |
| 10,886,172 B2 | 1/2021 | Chen |
| 10,964,717 B2 | 3/2021 | Kang et al. |

(Continued)

FOREIGN PATENT DOCUMENTS

WO    2018195423 A1    10/2018

*Primary Examiner* — Sarah K Salerno
(74) *Attorney, Agent, or Firm* — Servilla Whitney LLC

(57) ABSTRACT

Electronic devices and methods of forming the electronic devices are described. The electronic devices comprise a plurality of memory holes extending along a first direction through a plurality of alternating oxide and nitride layers. Each memory hole has a core oxide surrounded by a semiconductor material, the semiconductor material surrounded by a dielectric. The memory holes are staggered to provide a plurality of memory hole lines having spaced memory holes so that adjacent memory hole lines have the memory holes in a staggered configuration. A conductive material is on top of the stack of alternating oxide and nitride layers. A dielectric filled cut line extends through the conductive material in a direction across the plurality of memory hole lines. The dielectric filled cut line separates a first memory hole line from an adjacent second memory hole line without disabling the functionality of the memory holes.

18 Claims, 15 Drawing Sheets

(56) References Cited

U.S. PATENT DOCUMENTS

| | | |
|---|---|---|
| 10,998,329 B2 | 5/2021 | Koshizawa et al. |
| 11,024,371 B2 | 6/2021 | Cui et al. |
| 11,049,695 B2 | 6/2021 | Kang et al. |
| 2007/0042548 A1 | 2/2007 | Noh et al. |
| 2011/0031550 A1* | 2/2011 | Komori ............. H01L 27/11582 |
| | | 257/E21.21 |
| 2014/0175530 A1 | 6/2014 | Chien et al. |
| 2015/0123189 A1 | 5/2015 | Sun et al. |
| 2017/0069637 A1 | 3/2017 | Son et al. |
| 2017/0278864 A1 | 9/2017 | Hu et al. |
| 2018/0090307 A1 | 3/2018 | Brunner et al. |
| 2018/0144977 A1 | 5/2018 | Yu et al. |
| 2018/0330985 A1 | 11/2018 | Yu et al. |
| 2019/0074291 A1* | 3/2019 | Lu ..................... H01L 29/40117 |
| 2019/0393042 A1 | 12/2019 | Roy et al. |
| 2020/0051994 A1 | 2/2020 | Purayath et al. |
| 2020/0118822 A1 | 4/2020 | Falk et al. |
| 2020/0135755 A1* | 4/2020 | Shin .................. H01L 27/11556 |
| 2020/0185408 A1 | 6/2020 | Song et al. |
| 2020/0203373 A1 | 6/2020 | Kang et al. |
| 2020/0266211 A1 | 8/2020 | Tao et al. |
| 2020/0312874 A1 | 10/2020 | Kang et al. |
| 2020/0350014 A1 | 11/2020 | Liu |
| 2020/0350287 A1 | 11/2020 | Liu |
| 2020/0402562 A1 | 12/2020 | Li et al. |
| 2020/0411509 A1 | 12/2020 | Yang et al. |
| 2021/0043643 A1 | 2/2021 | Lu et al. |
| 2021/0126005 A1 | 4/2021 | Lu et al. |
| 2021/0210142 A1 | 7/2021 | Liu |
| 2021/0217773 A1 | 7/2021 | Kang et al. |
| 2021/0225865 A1 | 7/2021 | Wu |
| 2021/0233779 A1 | 7/2021 | Kang et al. |
| 2021/0233918 A1 | 7/2021 | Koshizawa et al. |
| 2021/0249436 A1 | 8/2021 | Ding et al. |
| 2021/0257385 A1 | 8/2021 | Hu et al. |
| 2021/0257386 A1 | 8/2021 | Wang et al. |
| 2021/0257387 A1 | 8/2021 | Huang et al. |

* cited by examiner

SELF-ALIGNED SELECT GATE CUT FOR 3D NAND

CROSS-REFERENCE TO RELATED APPLICATIONS

This application claims priority to U.S. Provisional Application No. 62/900,427, filed Sep. 13, 2019, the entire disclosure of which is hereby incorporated by reference herein.

TECHNICAL FIELD

Embodiments of the present disclosure generally relate to semiconductor devices and to methods for forming semiconductor devices. In particular, embodiments of the disclosure are directed to 3D NAND devices and methods of forming same.

BACKGROUND

Semiconductor technology has advanced at a rapid pace and device dimensions have shrunk with advancing technology to provide faster processing and storage per unit space. In NAND devices, the string current needs to be high enough to obtain sufficient current to differentiate ON and OFF cells. The string current is dependent on the carrier mobility which is enhanced by enlarging the grain size of the silicon channel.

Current 3D-NAND devices, which have a memory stack comprising alternating layers of an oxide material and a nitride material, have multiple memory holes between two slits. For the access to each cell by a word line and bit line, the memory holes between slits needs to be divided by select gate at drain (SGD) cut. In current memory devices, lines of memory holes are cut for bit line to prevent crossing more than one memory hole associated with a word line/bit line combination. The cut process renders at least one memory hole inoperative, decreasing the number of bits available for storage. In present arrangements, as illustrated in FIG. 1, the electronic device 10 comprises a combination of nine memory holes 12. A first column of memory holes 12 has five staggered holes and a second column of memory holes 12 has four staggered memory holes. The nine memory holes 12 are formed between adjacent slits 16 in a staggered arrangement. The cut line 14 crosses the middle hole 12 in the first column and passes between the second and third memory holes in the second column. This results in the destruction of one out of nine memory holes to provide the necessary separation.

As the node size of electronic devices decreases, are more memory holes are being packed into the same amount of space. In recent devices, a combination of 19 memory holes are formed, requiring four cut lines. This results in a loss of about 16% of the memory holes.

Accordingly, there is a need for semiconductor devices and methods of forming electronic devices with less memory hole losses during the cut processes.

SUMMARY

One or more embodiments of the disclosure are directed to electronic devices comprising a stack of alternating silicon layers and memory layers. Each of the layers lying within a plane defined by a first direction and a second direction and have a thickness along a third direction. A plurality of memory holes extend along the third direction through the thicknesses of at least some of the alternating silicon layers and memory layers. Each of the memory holes has a core oxide surrounded by a memory hole semiconductor material, and the memory hole semiconductor material is surrounded by a memory hole dielectric. The memory holes are staggered to provide a plurality of memory hole lines having spaced memory holes along the first direction so that adjacent memory hole lines have the memory holes in a staggered configuration. A conductive material is on top of the plurality of alternating oxide and memory layers and surrounds each of the memory holes so that a top portion of the memory holes are exposed. A dielectric filled cut line extends along the first direction through the conductive material. The dielectric filled cut line separates a first memory hole line from an adjacent second memory hole line without disabling the functionality of the memory holes.

Additional embodiments of the disclosure are directed to methods of forming a memory device. A plurality of memory holes is opened in a stack of alternating silicon layers and nitride layers. The silicon layers and nitride layers lying along a plane formed by a first direction and a second direction with a thickness extending along a third direction. The openings extend along the third direction. The memory holes are filled with a core oxide, a memory hole semiconductor material and a memory hole nitride layer. A cut line is formed along the first direction between adjacent memory hole rows. The cut line is filled with a dielectric.

Further embodiments of the disclosure are directed to methods of forming a memory device. The methods comprise: opening a plurality of memory holes through a first layer stack on a second layer stack, the first layer stack comprising alternating silicon layers and nitride layers, the second layer stack comprising alternating oxide layers and nitride layers, each of the layers of the first layer stack and the second layer stack lying along a plane formed by a first direction and a second direction and having a thickness along a third direction, and the openings extend along the third direction, the plurality of memory holes are staggered to provide a plurality of memory hole lines having spaced memory holes along the first direction so that adjacent memory hole lines have the memory holes in a staggered configuration; forming a conformal oxide layer on the first layer stack and sidewalls of the memory holes; forming a conformal memory hole nitride layer on the conformal oxide layer; forming a conformal semiconductor material layer on the conformal memory hole nitride layer; filling the memory hole with a core oxide; removing overburden material to expose a top surface of the core oxide and a top surface of the semiconductor material and the conformal memory hole nitride layer; forming a slit extending along the first direction through at least the first layer stack, the slit having a width along the second direction and a depth along the third direction; recessing the nitride layers of the first layer stack through the slit to leave memory layer gaps and expose first and second surfaces of the silicon layers; forming an oxide layer in the memory layer gaps; forming a barrier layer on the oxide layer in the memory layer gaps; filling the memory layer gaps with a conductive material; forming a cut line along the first direction between adjacent memory hole rows; and filling the cut line with a dielectric.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
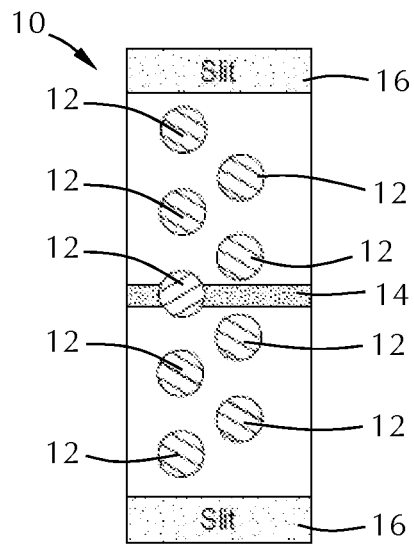
FIG. 1 illustrates a prior art memory device in which one of nine memory holes are inoperative as a result of a cut line.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

As used in this specification and the appended claims, the terms "precursor", "reactant", "reactive gas" and the like are used interchangeably to refer to any gaseous species that can react with the substrate surface.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been described in great detail to avoid unnecessarily obscuring this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

In order to reduce the array size of 3D-NAND devices, the number of memory strings (e.g., holes) between slits (nHole) needs to be increased. The holes under the same bit line level should be separately accessible by a combination of bit line (BL) and word line (WL). In other words, holes under same bit line are selected independently by a select gate for drain (SGD) and bit line. For this purpose, SGDs between slits should be separated by a SGD-cut. Accordingly, one or more embodiments provide 3D NAND structures and method of fabricating 3D-NAND devices using a non-destructive self-aligned select gate cut process.

One or more embodiments of the disclosure advantageously provide methods for forming electronic devices in which the self-aligned select gate cut process eliminates or minimizes losses of memory holes. Some embodiments of the present disclosure relate to electronic devices 100, for example, the device illustrated in FIG. 2 comprising a plurality of memory holes 110 separated by a cut line 120 that does not deactivate or destroy the functionality of any of the memory holes 110.

Figure 3:
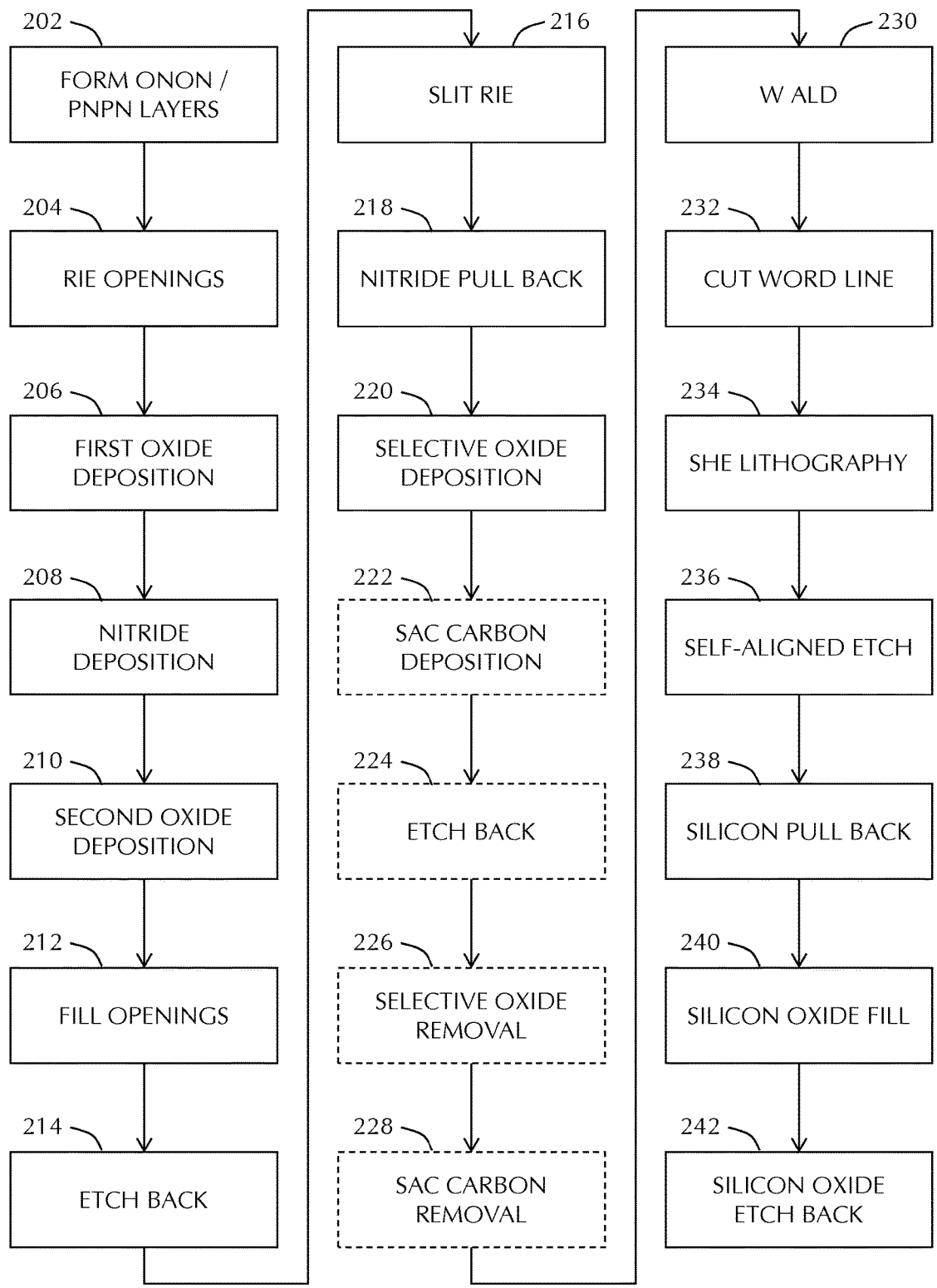
FIG. 3 illustrates an exemplary method of forming an electronic device according to one or more embodiment of the disclosure.

Some embodiments of the disclosure are directed to methods 200 of forming electronic devices. FIG. 3 illustrates an exemplary processing method for forming an electronic device including optional processes (shown in dotted lines). FIGS. 4 through 27 illustrates an exemplary process for forming an electronic device. Embodiments of the disclosed electronic devices are described by way of the methods 200 illustrated and described herein.

Figure 2:
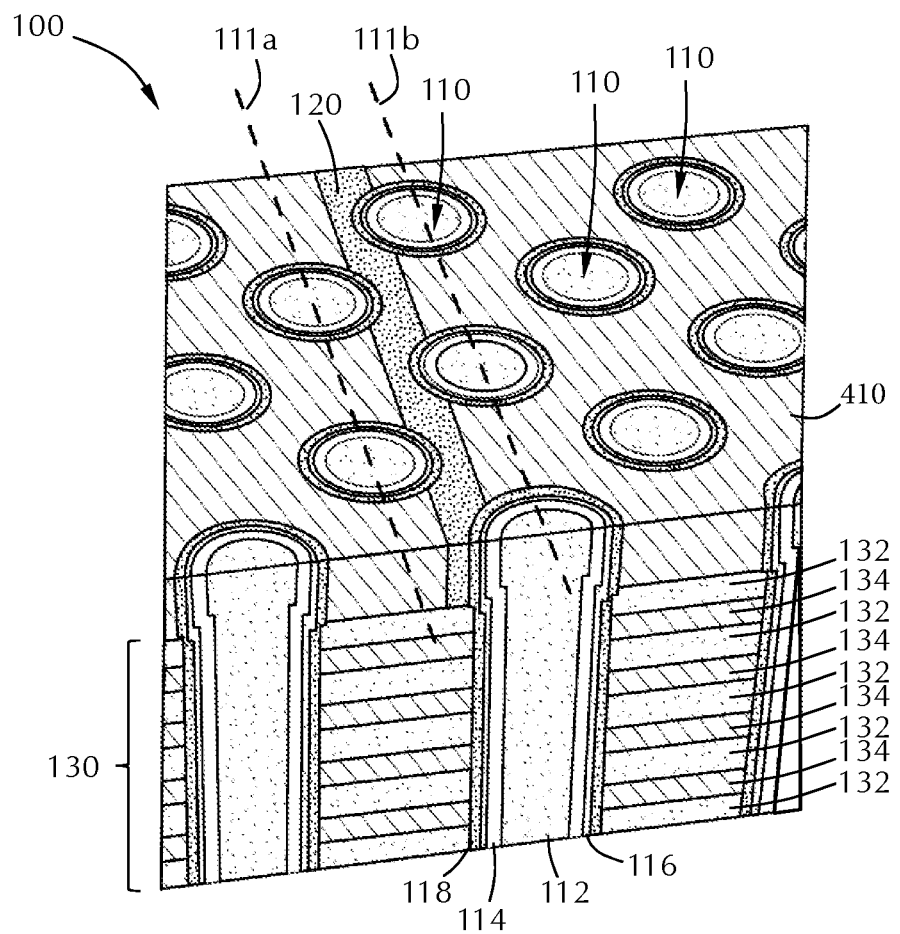
FIG. 2 illustrates a memory device in accordance with one or more embodiment of the disclosure.

FIG. 3 illustrates a flow chart for an exemplary method 200 for forming a memory device (e.g., electronic device 100 shown in FIG. 2). The skilled artisan will recognize that the method 200 can include any or all of the processes illustrated. Additionally, the order of the individual processes can be varied for some portions. The method 200 of some embodiments starts at any of the enumerated processes without deviating from the disclosure.

With reference to FIGS. 3 through 27, the method 200 begins at operation 202 with the formation of a first layer stack 302 and a second layer stack 310. The first layer stack 302 comprises alternating nitride layers 304 and silicon layers 306. The second layer stack 310 comprises alternating oxide layers 312 and nitride layers 314. The first layer stack 302 is also referred to as the PN stack and the second layer stack 310 is also referred to as the ON stack. The use of the ordinals "first" and "second" are merely for identification purposes and should not be taken as a procedural order.

In the embodiments illustrated in the Figures, the first layer stack 302 comprises five layers and the second layer stack 310 comprises five layers. The skilled artisan will recognize that this is merely representative of one possible configuration. In some embodiments, the first layer stack 302 comprises more than 20, 40, 60, 80, 100, 125, 150, 175, 200, 225 or 250 layers. In some embodiments, the second layer stack 310 comprises more than 20, 40, 60, 80, 100, 125, 150, 175, 200, 225 or 250 layers.

Figure 4:
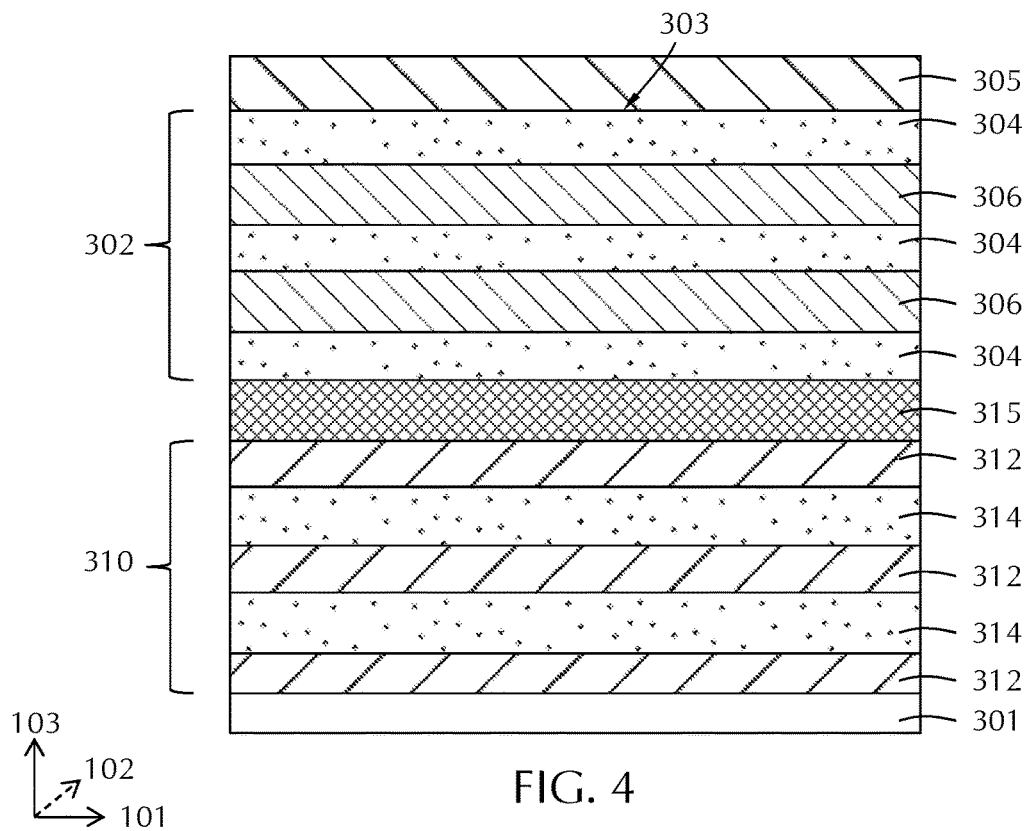
FIGS. 4 through 27 illustrate a memory device being formed by a method according to one or more embodiment of the disclosure.

Each of the layers of the first layer stack 302 and the second layer stack 310 lie within a plane formed by a first direction 101 and a second direction 102. In FIG. 4, the first direction 101 is illustrated as left-to-right on the page, the second direction 102 extends in a direction behind the page of the illustration, and the third direction 103 extends from bottom-to-top of the page. The first direction 101 and second direction 102 may also be referred to as the X-axis direction and the Y-axis direction, respectively, or similar terminology. The skilled artisan will recognize that the second direction 102 is not limited to a direction that extends 90 degrees relative to the first direction 101. The angle between the first direction 101 and the second direction 102 can be any suitable angle. Each of the layers of the first layer stack 302 and the second layer stack 310 has a thickness measured along a third direction 103. The third direction 103 may also be referred to as the Z-axis direction, or similar. The skilled artisan will recognize that the third direction 103 is not limited to a direction that extends normal to the plane formed by the first direction 101 and the second direction 102.

The second layer stack 310 is formed on an underlying substrate 301. The substrate can be any suitable material known to the skilled artisan. As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

The nitride layers 304 can be any suitable oxides known to the skilled artisan deposited by any suitable technique. In one or more embodiments, the nitride layers 304 comprise one or more of silicon oxide ($SiO_2$) or aluminum oxide ($Al_2O_3$). The skilled artisan will recognize that the stoichiometric relationship of the idealized material (e.g., silicon dioxide) is merely representative of the identity of the components of the film and that the actual stoichiometric ratios of the elements can vary from the stated compound.

The silicon layers 306 can be any suitable semiconductor material known to the skilled artisan deposited by any suitable technique. In some embodiments, the silicon layers 306 comprise un-doped, n-doped or p-doped poly-silicon. In one or more embodiments, the nitride layers 304, 314 are independently selected from one or more of silicon nitride, aluminum nitride or titanium nitride.

In one or more embodiments individual layers of the first layer stack 302 and the second layer stack 310 are independently deposited by chemical vapor deposition (CVD) or physical vapor deposition (PVD). The individual alternating layers may be formed to any suitable thickness. In one or more embodiments, the silicon layers 306 have a smaller thickness than the nitride layers 304. In some embodiments, the oxide layers 312 have a smaller thickness than the nitride layers 304. In some embodiments, the thickness of each layer in the first layer stack 302 and/or the second layer stack 310 is approximately equal. As used in this regard, thicknesses which are approximately equal are within +/−5% of each other. In one or more embodiments, the layers have a thickness in a range of from about 0.5 nm to about 30 nm, including about 1 nm, about 3 nm, about 5 nm, about 7 nm, about 10 nm, about 12 nm, about 15 nm, about 17 nm, about 20 nm, about 22 nm, about 25 nm, about 27 nm, and about 30 nm.

In some embodiments, the first layer stack 302 and the second layer stack 310 are separated by an etch stop layer (ESL) 315. In the embodiments illustrated, the first layer stack 302 has a bottom layer that is a nitride layer 304. In some embodiments, the first layer stack 302 has a silicon layer 306 as the bottom layer in direct contact with the etch stop layer 315. In some embodiments, the etch stop layer 315 is a nitride layer of the same material as the nitride layers 304 of the first layer stack 302.

In some embodiments, a dielectric capping layer 305 is positioned over the first layer stack 302. The dielectric capping layer 305 of some embodiments comprises a material that is etch selective relative to the nitride layers 304, 314 or oxide layers 312. In some embodiments, the dielectric capping layer 305 is omitted. In some embodiments, the dielectric capping layer 305 is replaced with a silicon layer and is part of the first layer stack 302.

Figure 5:
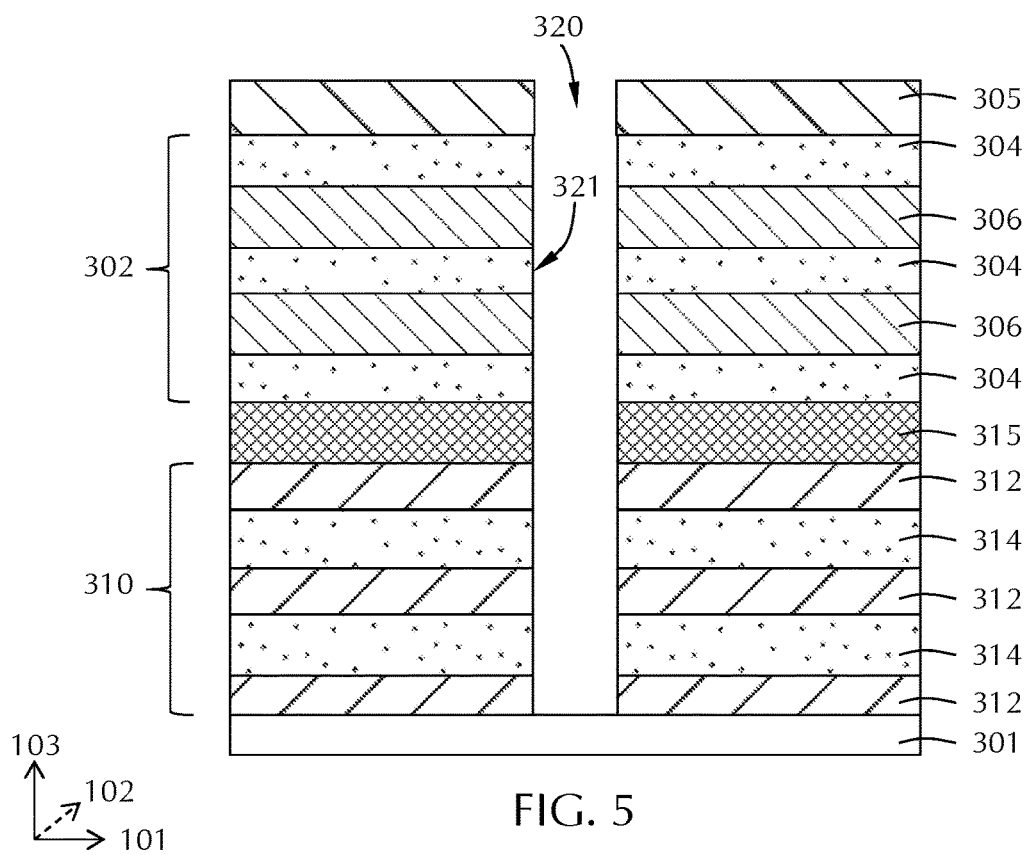

At process 204, as shown in FIG. 5, a plurality of openings (also referred to as memory holes 320) are formed through the first layer stack 302. While FIG. 5 shows one memory hole 320, the skilled artisan will recognize that more than one memory hole may be formed. In some embodiments, the memory holes 320 are formed in groups of 20, with five rows of four holes.

In some embodiments, the memory holes 320 are formed through the first layer stack 302 and the second layer stack 310. The memory holes 320 are formed by any suitable technique including, but not limited to, reactive ion etching (RIE).

The memory holes 320 are openings formed along the third direction 103. While the illustrations show memory holes 320 extending perpendicular to the plane of the layers for the first layer stack 302 and the second layer stack 310, the skilled artisan will recognize that this is merely representative of one possible configuration. In some embodiments, the memory holes 320 extend at an angle to the plane of the first layer stack 302 in the range of 30° to 90°. The memory holes 320 extend from a top surface 305 of the first layer stack 302 to any suitable depth. In some embodiments, the memory holes 320 extend from the top surface 305 through both the first layer stack 302 and the second layer stack 310 to the underlying substrate (not shown).

The number of memory holes 320 formed can be any suitable number depending, for example, on the particular device being formed. In the illustrated embodiment, which is a small portion of an electronic device, there are 20 memory holes formed in a staggered configuration. In the embodiment shown, the memory holes 320 are formed in alternating lines 322 of three memory holes 320 and two memory holes 320. The lines 322 extend along the first direction 101. In some embodiments, the plurality of memory holes 320 are staggered to provide a plurality of memory hole lines having spaced memory holes along the first direction so that adjacent memory hole lines have the memory holes in staggered configuration. Stated differently, in some embodiments, the memory holes 320 are formed in five separate and staggered rows 324 of four memory holes 320.

While 20 memory holes 320 are illustrated in the embodiment shown in FIG. 2, the skilled artisan will recognize that this is merely representative of one possible configuration and should not be taken as limiting the scope of the disclosure. In some embodiments, there are less than 20 memory holes 320 or more than 20 memory holes 320.

Figure 6A:
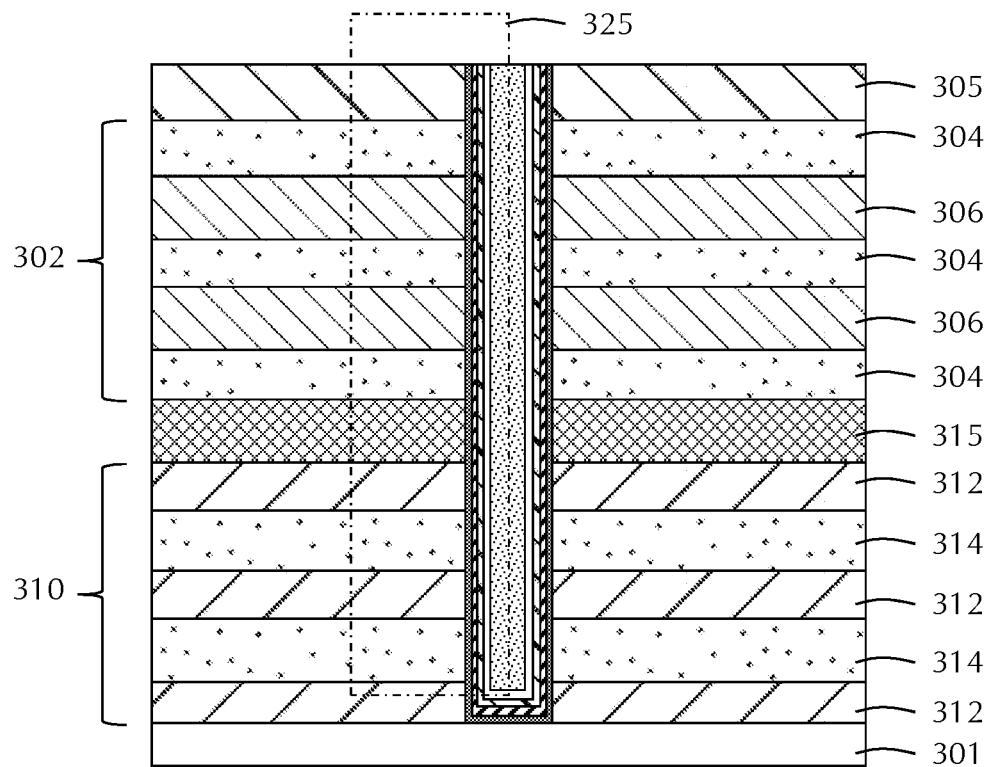
Figure 6B:
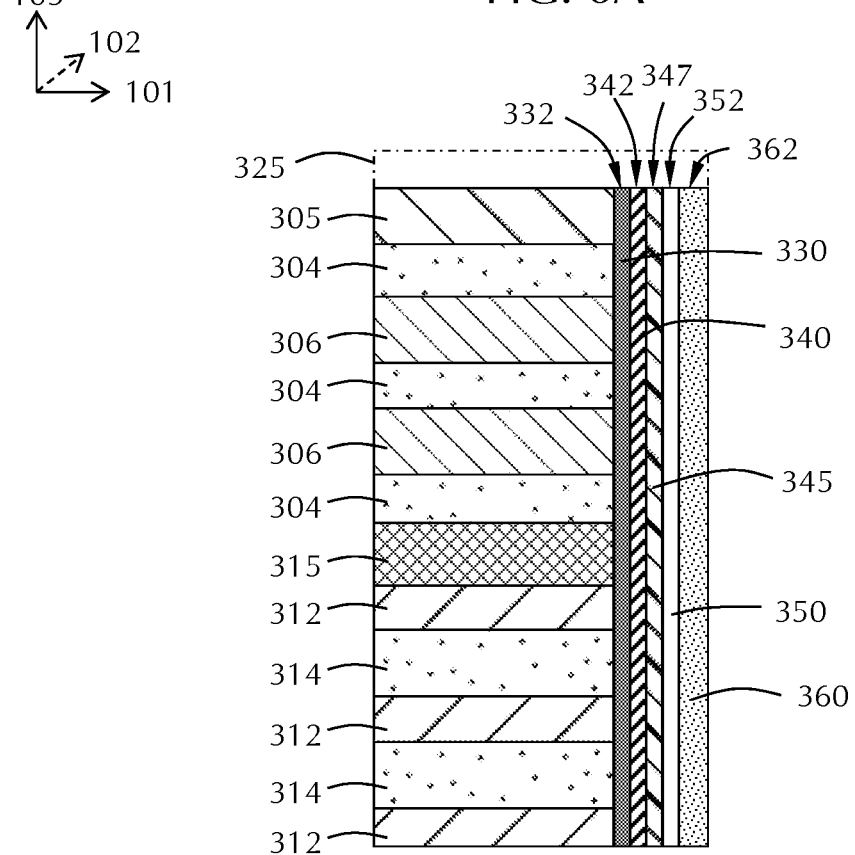

FIG. 6A illustrates the electronic device after process 206, process 208, process 210, process 212 and process 214 have been performed. FIG. 6B illustrates an expanded view of region 325 of FIG. 6A. In process 206, a memory hole first oxide layer 330 is formed on the first layer stack 302 and the sidewalls 321 of the memory holes 320. In some embodiments, the memory hole first oxide layer 330 is a conformal layer. In some embodiments, the memory hole first oxide layer 330 comprises silicon oxide. In some embodiments, the memory hole first oxide layer 330 forms on the top surface 313 of the first layer stack 302 or on a separate layer above the first layer stack 302 (e.g., a dielectric capping layer 305). In some embodiments, the conformal memory hole first oxide layer 330 comprises aluminum oxide. In some embodiments, the conformal memory hole first oxide layer 330 is any suitable dielectric material. The memory hole first oxide layer 330 can be formed by any suitable technique known to the skilled artisan including, but not limited to, atomic layer deposition (ALD).

In process 208, a memory hole nitride layer 340 is formed on the memory hole first oxide layer 330. The memory hole nitride layer 340 is formed on the top surface of the first oxide layer 330 and on the sidewalls of the first oxide layer 330 in the memory hole 320. In some embodiments, the memory hole nitride layer 340 comprises one or more of silicon nitride, titanium nitride or aluminum nitride. In some embodiments, the memory hole nitride layer 340 is a conformal layer. The nitride layer 340 can be formed by any suitable technique known to the skilled artisan including, but not limited to, atomic layer deposition (ALD).

In process 210, a memory hole second oxide layer 345 is formed on the memory hole nitride layer 340. The memory hole second oxide layer 345 is formed on the top surface of the nitride layer 340 and on the sidewalls of the nitride layer 340 in the memory hole 320. In some embodiments, the memory hole second oxide layer 345 is a conformal layer. In some embodiments, the memory hole second oxide layer 345 comprises one or more of silicon oxide or aluminum oxide. In some embodiments, the conformal memory hole first oxide layer 330 is any suitable dielectric material. The memory hole second oxide layer 345 can be formed by any suitable technique known to the skilled artisan including, but not limited to, atomic layer deposition (ALD).

In process 212, an optional semiconductor material layer 350 is formed on the second oxide layer 345. The semiconductor material layer 350 is formed on the top surface of the conformal second oxide layer 345 and on the sidewalls of the conformal second oxide layer 345 in the memory hole 320. In some embodiments, the conformal semiconductor material 350 comprises a poly-silicon layer. The conformal semiconductor material layer 350 can be formed by any suitable technique known to the skilled artisan. In some embodiments, the conformal semiconductor material 350 comprises a p-doped or n-doped silicon layer.

The remaining opening of the memory hole 320 is filled with a core oxide 360. The core oxide 360 can be deposited by any suitable technique. In the illustrated embodiment, the core oxide 360 forms an overburden on the top surface of the optional conformal semiconductor material layer 350 and on the sidewalls of the optional conformal semiconductor material layer 350. In some embodiments, the core oxide 360 is deposited directly on the conformal semiconductor material layer 345 to form an overburden on the top surface of the conformal semiconductor material layer 345.

In process 214, the overburden of the core oxide 360, the semiconductor material layer 350 and the memory hole second oxide layer 345 on the memory hole nitride layer 340 is removed, and optionally, the memory nitride layer 340 on the top surface of the memory hole first oxide layer 330 is removed. Removing these layers exposes a top surface 332 of the memory hole first oxide layer 330, a top surface 342 of the memory hole nitride layer 340, a top surface 347 of the memory hole second oxide layer 345, a top surface 352 of the optional conformal semiconductor material layer 350 and a top surface 362 of the core oxide 360 in the memory hole 320. The overburden and layers deposited on the first layer stack 302 can be removed by any suitable technique including, but not limited to, etching or chemical-mechanical planarization (CMP). In some embodiments, the core oxide 360 is deposited without forming the overburden and the etch back process 214 is not performed.

Figure 7:
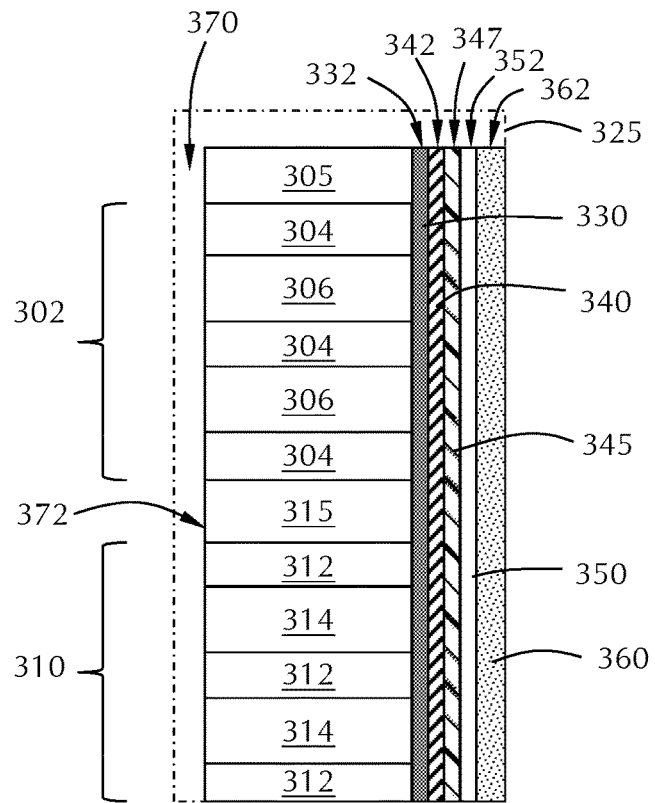

FIGS. 7 through 19 are shown in the expanded region 325. At process 216, as shown in FIG. 7, a slit 370 is etched through the first layer stack 302, and optionally, through the second layer stack 310. The sidewalls 372 of the slit 370 are formed by sidewalls of the alternating oxide and nitride layers. The slit 370 can be formed by any suitable technique including, but not limited to, RIE. The slit 370 extends along the first direction 101 with a width along the second direction 102 and a depth along the third direction 103.

Figure 8:
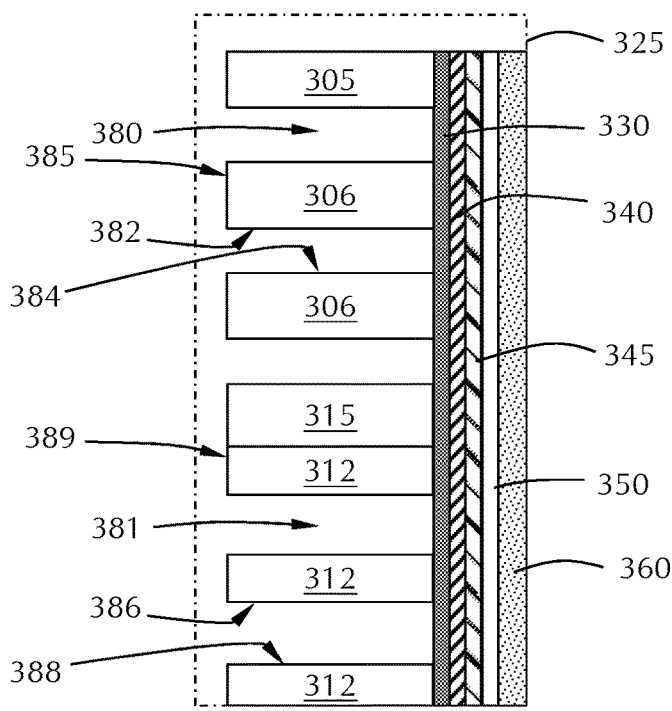

At process 218, as shown in FIG. 8, the nitride layers 304 and/or nitride layers 314 are etched through the slit 370. Removal of the nitride layers 304 leaves memory layer gaps 380 and exposes first surfaces 382 and second surfaces 384 of the spaced silicon layers 306. In some embodiments, removal of the nitride layers 314 leaves memory layer gaps 381 and exposes first surfaces 386 and second surfaces 388 of the spaced oxide layers 312. The nitride layers 304 and/or nitride layers 314 of some embodiments are removed through the slit 370 by selective etching (e.g., selective wet etching or selective dry etching). In some embodiments, the nitride layers 304 and nitride layers 314 are removed through the slit 370 by selective etching, or any other suitable technique known to the skilled artisan.

Figure 9:
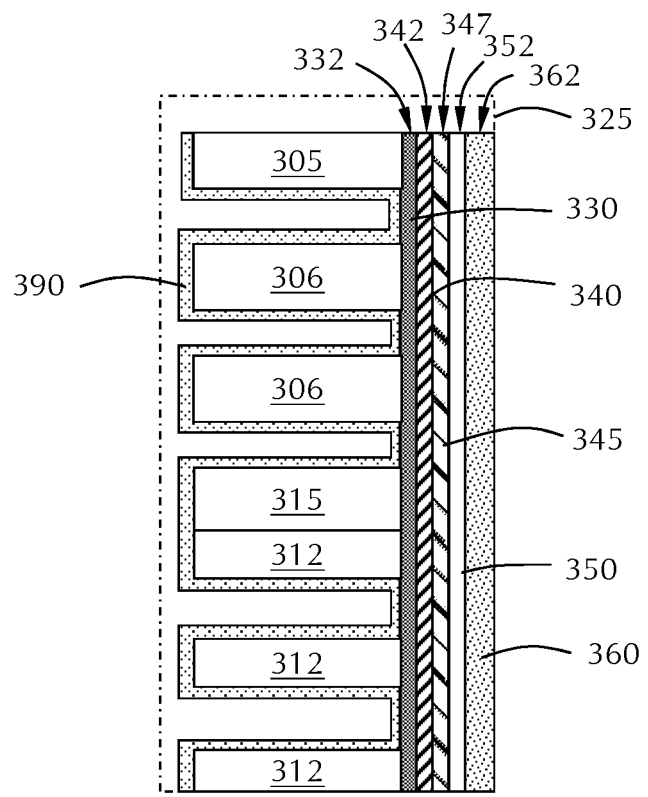

At process 220, as shown in FIG. 9, an oxide layer 390 is formed in the memory layer gaps 380 and/or memory layer gaps 381. In some embodiments, the oxide layer 390 comprises any suitable insulator material and is not limited to oxygen containing species. In some embodiments, the oxide layer 390 comprises aluminum oxide. In some embodiments, the oxide layer 390 is a conformal film deposited in the memory layer gaps 380 and/or memory layer gaps 381, on the first surfaces 382 and second surfaces 384 of the silicon layers 306 and/or on the first surfaces 386 and second surfaces 388 of the oxide layers 312, and on the sidewalls 372 of the slit 370 on the sidewall face 385 of the spaced silicon layers 306 and/or sidewall face 389 of the spaced oxide layers 312. In some embodiments, the insulator material comprises any suitable material known to the skilled artisan. In one or more embodiments, the oxide layer 390 comprises an oxide, a nitride or an oxynitride. In some embodiments, oxide layer 390 is selected from one or more of silicon oxide (SiOx), silicon nitride (SiN), and silicon oxynitride ($SiO_xN_y$). the oxide layer 390 of some embodiments is formed by any suitable technique including, but not limited to, ALD.

Figure 10A:
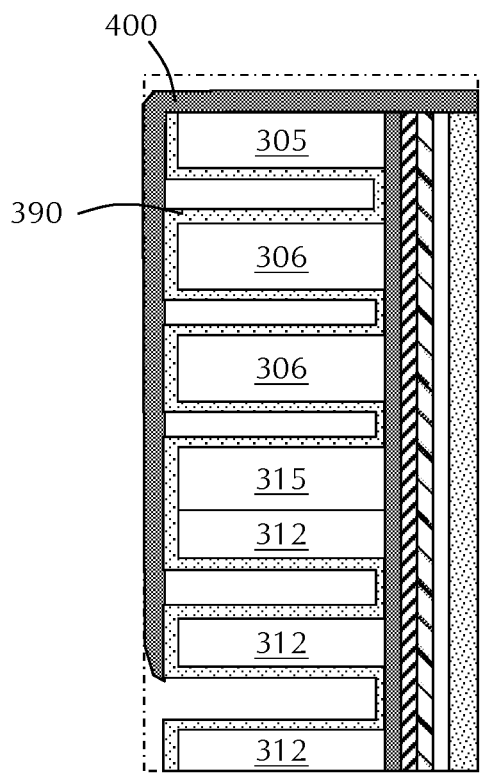
Figure 10B:
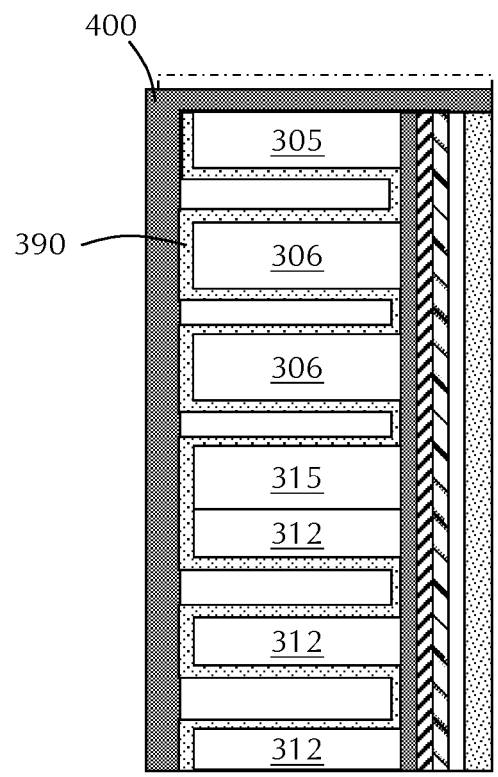

At optional process 222, as shown in FIGS. 10A and 10B, an optional sacrificial layer 400 is formed in the slit 370. In some embodiments, the optional sacrificial layer 400 comprises a sacrificial carbon film. In some embodiments, the sacrificial carbon film fills the slit 370. In some embodiments, the sacrificial carbon film fills the slit 370 and forms an overburden 402 on the top of the oxide layer 390.

In some embodiments, the sacrificial carbon film is a non-conformal carbon film deposited by any suitable technique. In some embodiments, the non-conformal carbon film is deposited by chemical vapor deposition. In some embodiments, the non-conformal carbon film covers the sidewalls 372 of the slit to the bottom of the slit 370, as shown in FIG. 10A. In some embodiments, as shown in FIG. 10B, the optional sacrificial layer 400 is a non-conformal carbon film that covers a portion of the sidewalls 372 and does not extend to the bottom of the slit 370.

Figure 11:
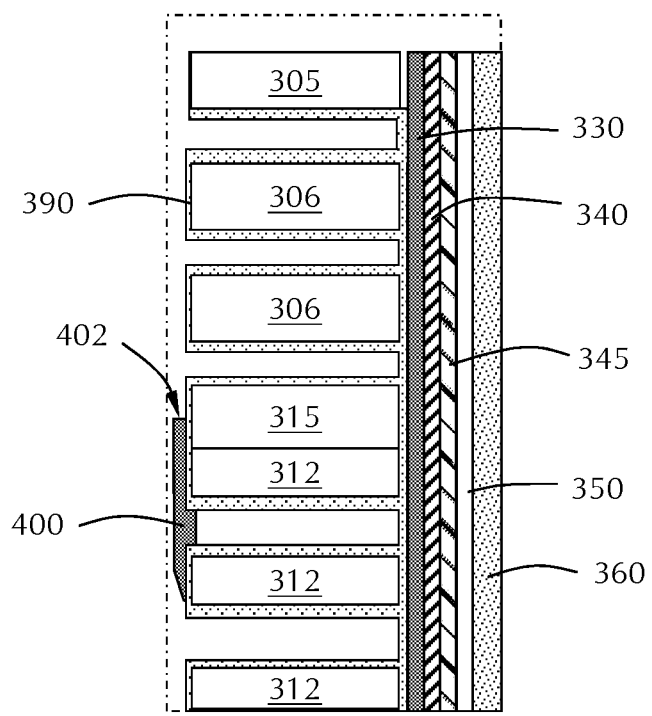

At optional process 224, as shown in FIG. 11, the optional sacrificial layer 400 is etched back to lower the top 402 of the sacrificial layer 400. In some embodiments, the top 402 of the sacrificial layer 400 is lowered to expose the first layer stack 302 and cover the second layer stack 310. In some embodiments, the sacrificial layer 400 is etched to lower the top 402 of the sacrificial layer 400 to a level within the thickness of the etch stop layer 315. The sacrificial layer 400 can be etched by any suitable technique known to the skilled artisan.

Figure 12:
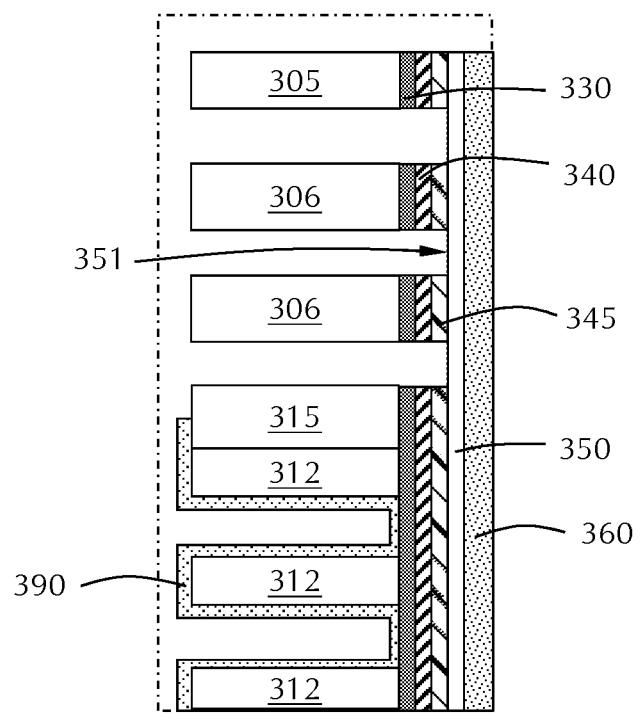

FIG. 12 shows the electronic device after optional process 226 and optional process 228. At optional process 226, the oxide layer 390 on the first layer stack 302 and covering the spaced silicon layers 306 within the slit 370 is removed. The oxide 390 can be removed by any suitable technique known to the skilled artisan. In the illustrated embodiment, removal of the oxide layer 390 from the spaced silicon layers 306 also removes a portion of memory hole first oxide layer 330, memory hole nitride layer 340 and memory hole second oxide layer 345 exposing a surface 351 of the semiconductor material 350

At optional process 228, the sacrificial layer 400 is removed from the slit 370. Removal of the sacrificial layer 400 exposes the spaced oxide layers 312 of the second layer stack 310 with the oxide layer 390 thereon to the slit 370. In some embodiments, optional process 226 and optional process 228 occur at the same time so that the oxide layer 390 is removed from the spaced silicon layers 306 of the first layer stack 302 and the sacrificial layer 400 is removed from the oxide layer 390 on the second layer stack 310 at the same time.

At process 230, a conductive material 410 is deposited on the spaced silicon layers 306 of the first layer stack 302 to fill the memory layer gaps 380. In some embodiments, the conductive material 410 is deposited on the spaced oxide layers 312 of the second layer stack 310 on the oxide layer 390 to fill the gaps 381 between the spaced oxide layers 312.

Figure 13:
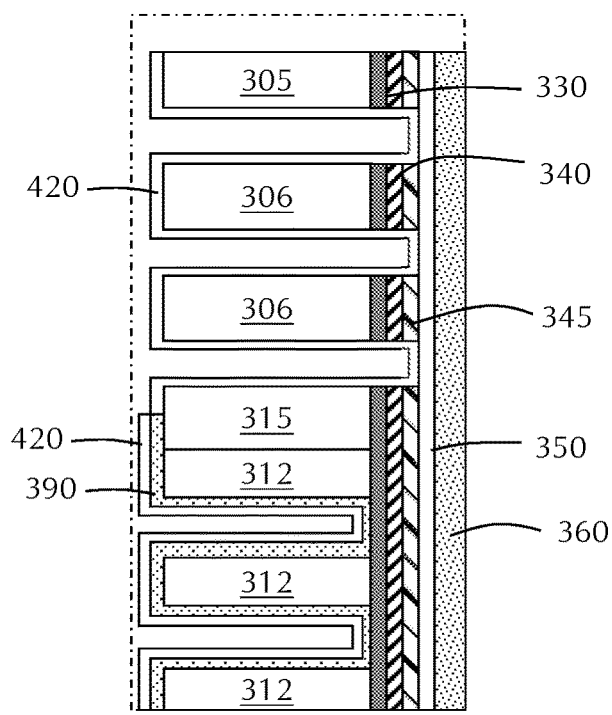
Figure 14:
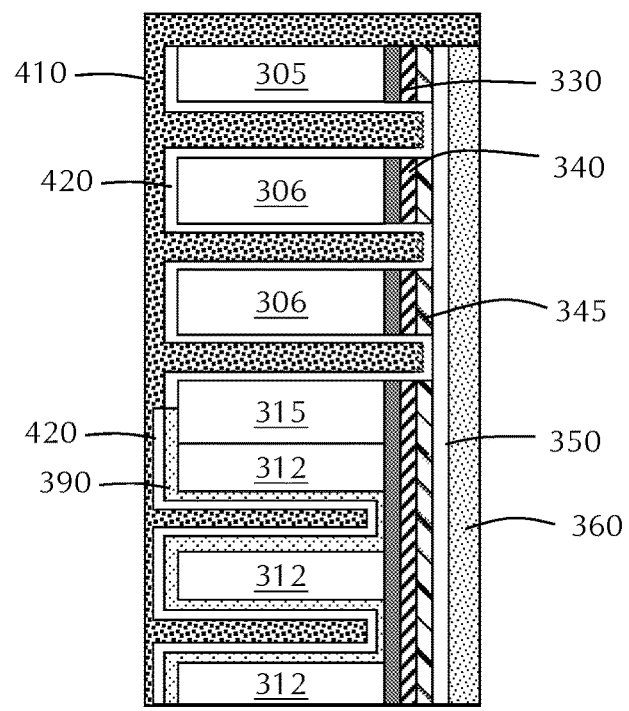

In some embodiments, an optional liner 420 (also referred to as a barrier layer) is deposited on the spaced silicon layers 306 prior to depositing the conductive material 410. The optional liner 420 of some embodiments is a conformal film formed in the memory layer gaps 380 and on the first surfaces 382, second surfaces 384 and the sidewall faces 385 of the spaced nitride layers 304. In some embodiments, the optional liner 420 is deposited on the spaced oxide layers 312 of the second layer stack 310. FIG. 13 shows the electronic device with the optional liner 420 and FIG. 14 shows the electronic device of FIG. 13 with the conductive material 410 formed on the optional liner 420. In the illustrated embodiment, the optional liner 420 is a conformal film deposited on the oxide layer 390 formed on the first surfaces 386, second surfaces 388 and sidewall faces 389 of the spaced oxide layers 312. The optional liner 420 can be any suitable material or combination of materials known to the skilled artisan deposited by any suitable technique. In some embodiments, the optional liner 420 comprises multiple layers. In some embodiments, the optional liner 420 comprises titanium nitride and the conductive material 410 comprises tungsten.

In one or more embodiments, the conductive material 410 comprises one or more of metal, metal nitride, conductive metal compound or a semiconductor material. In one or more embodiments, the conductive material 410 is selected from one or more of tungsten (W), molybdenum (Mo), tantalum (Ta), niobium (Nb), osmium (Os), zirconium (Zr), iridium (Ir), rhenium (Re), or titanium (Ti). In one or more embodiments, the barrier layer is selected from one or more of titanium nitride (TiN), tantalum nitride (TaN), tungsten nitride (WN), molybdenum nitride (MoN), and zirconium nitride (ZrN). In one or more embodiments, the conductive material 410 is selected from one or more of tungsten oxide (WOx), ruthenium oxide (RuOx), and iridium oxide (IrOx). In one or more embodiments, the barrier layer is selected from one or more of silicon nitride (SiN), silicon oxide ($SiO_2$), and tungsten oxide ($WO_3$). In one or more embodiments, the conductive material 410 comprises a semiconductor material selected from one or more of silicon (Si), silicon germanium (SiGe), and germanium (Ge).

Figure 15:
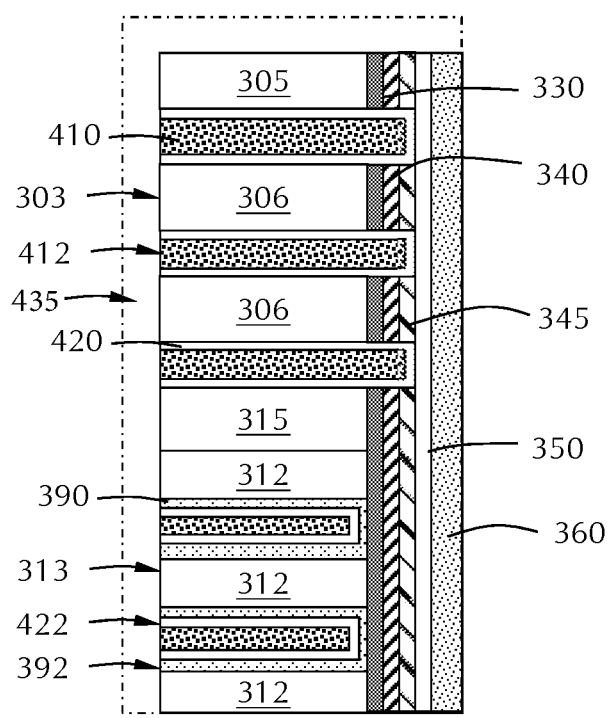

In process 232 and shown in FIG. 15, a word line opening 435 is cut. The word line opening 435 exposes the end surface 392 of the oxide layer 390, the end surface 412 of the conductive material 410 and the end surface 422 of the optional liner 420. The word line opening 435 also exposes the end surface 303 of the silicon layers 306 and the end surface 313 of the oxide layers 312.

Figure 16:
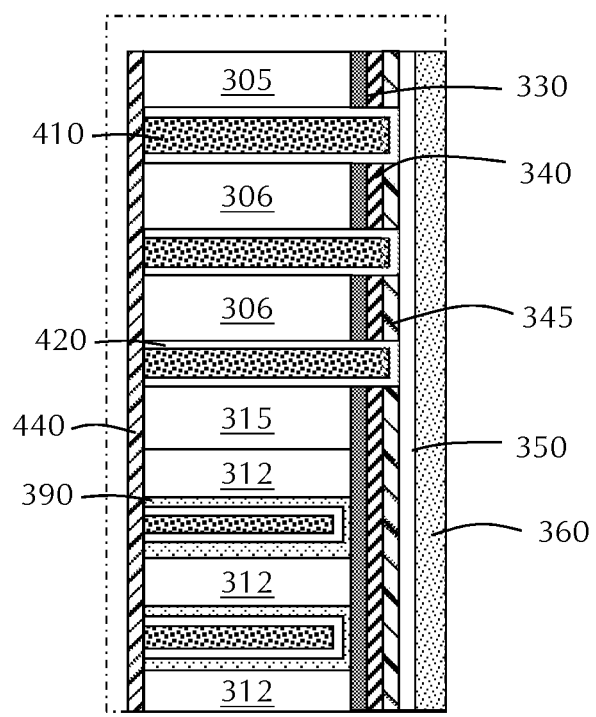

FIG. 16 shows an embodiment in which a dielectric material 440 has been conformally deposited on the exposed surfaces of the conductive material 410, the optional liner 420, the spaced silicon layers 306, the spaced oxide layers 312 and the oxide layer 390. In one or more embodiments, the dielectric material 440 comprises any suitable dielectric material known to the skilled artisan. As used herein, the term "dielectric material" refers to an electrical insulator that can be polarized in an electric field. In some embodiments, the dielectric material comprises one or more of oxides, carbon doped oxides, silicon dioxide (SiO), porous silicon dioxide ($SiO_2$), silicon dioxide (SiO), silicon nitride (SiN), silicon dioxide/silicon nitride, carbides, oxycarbides, nitrides, oxynitrides, oxycarbonitrides, polymers, phosphosilicate glass, fluorosilicate (SiOF) glass, or organosilicate glass (SiOCH).

Figure 17:
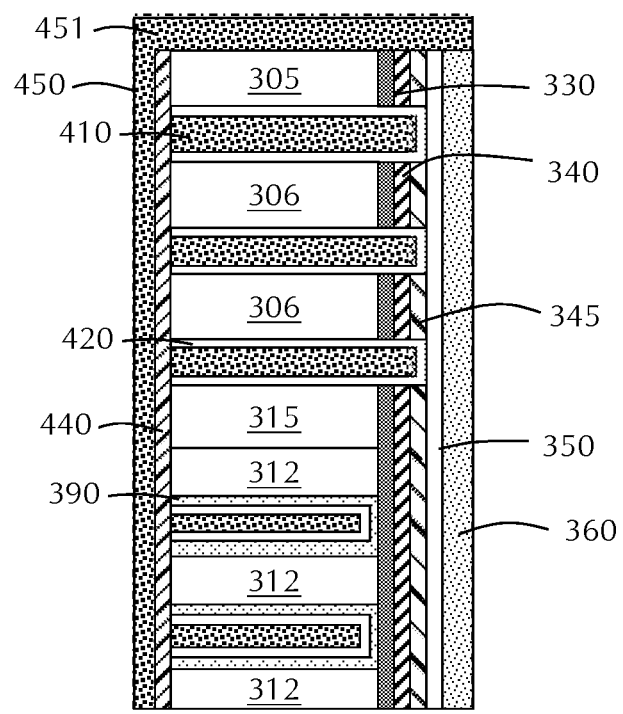

FIG. 17 shows the electronic device after deposition of a metal fill 450 in the slit 370 on the dielectric material 440 and on the top surface of the first layer stack 302. After deposition of the metal fill 450, an etch or CMP process is used to remove the metal fill overburden 451 from the top surface 301 of the first layer stack 302. In some embodiments, the metal fill 450 is etched to a level below the top surface 301 of the first layer stack 302 but above the top-most metal fill 410a, as shown.

Figure 18:
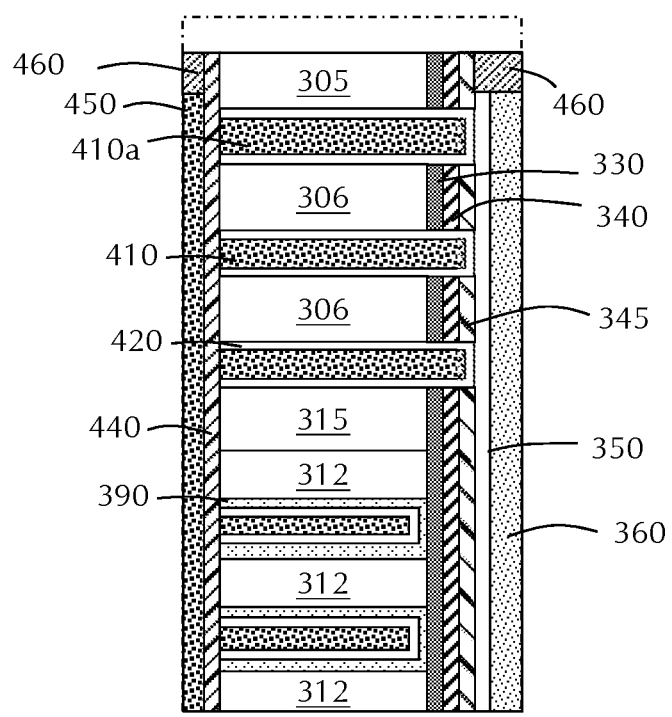

FIG. 18 shows an embodiment in which the top portion of the metal fill 450 is etched back or recessed below the top surface 301 of the first layer stack 302, or below the top surface of a cap layer 302 and above the top-most metal fill 410a, and a metal oxide layer 460 is deposited in the recessed portion. In some embodiments, the metal oxide layer 460 comprises aluminum oxide. The etch back process of some embodiments also removes the top portion of the semiconductor material 350 and the core oxide 360 in the memory hole.

FIGS. 19 through 27 show a region of the electronic device where the cut line 120 will be formed. In process 234, a hardmask 470 is formed on the top surface 301 (the top surface of the cap layer in the illustrated embodiment) of the first layer stack 302 and on the top surface 462 of the metal oxide layer 460. A photoresist 480 is formed on the hardmask 470 and patterned to create opening 485. The opening 485 is positioned over the edges of adjacent rows of memory holes. See FIG. 2. The positioning of the opening 485 in some embodiments is aligned to cover a portion of memory holes from one line and a portion of memory holes from another line of the memory holes so that material between the two lines of memory holes can be removed. This placement has sufficient forgiveness so that slight misalignment of the mask during lithography does not destroy any of the memory holes.

Figure 19:
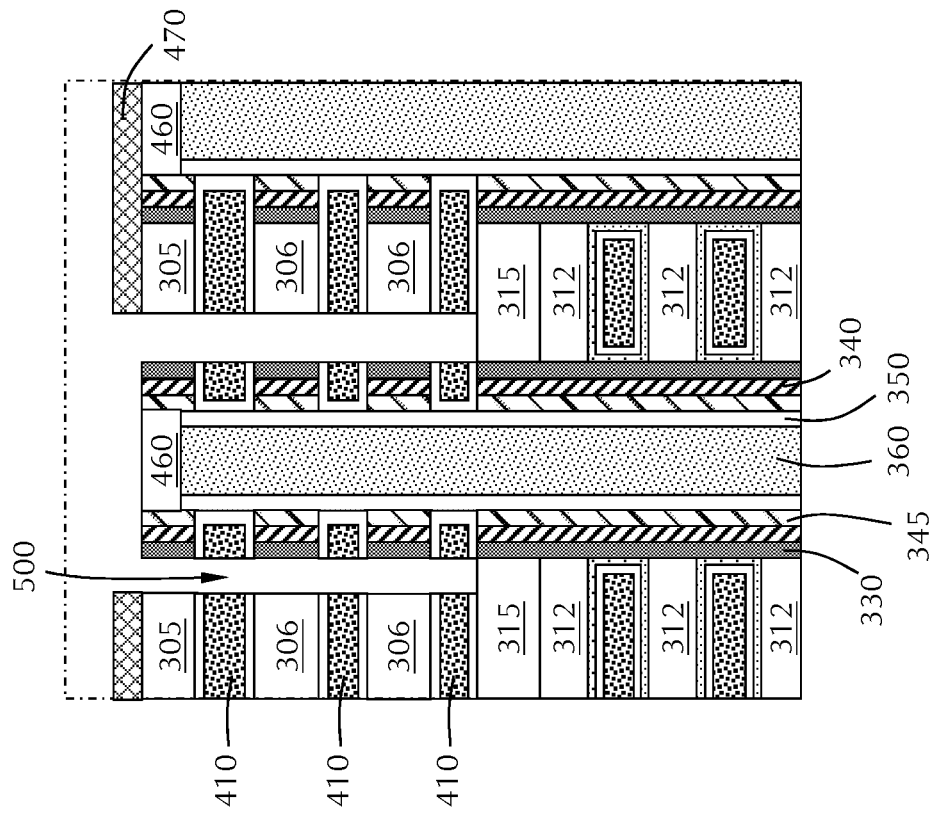
Figure 20:
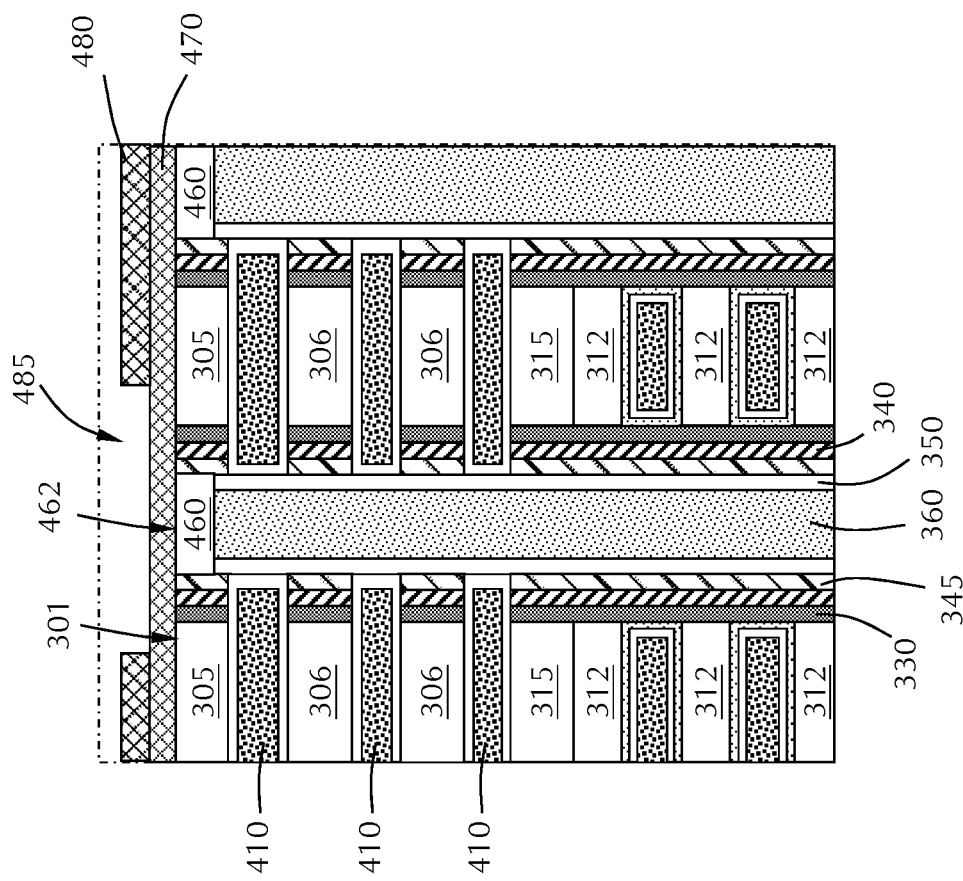

FIG. 20 shows the region of FIG. 19 after a self-aligned etch process 236. The self-aligned etch process 236 of some embodiments is an anisotropic etch. The anisotropic etch through the photoresist removes a portion of the hardmask 470 and all layers below to a predetermined depth to form an opening 500. In the illustrated embodiment, the predetermined depth is at the level of the etch stop layer 315.

Figure 21:
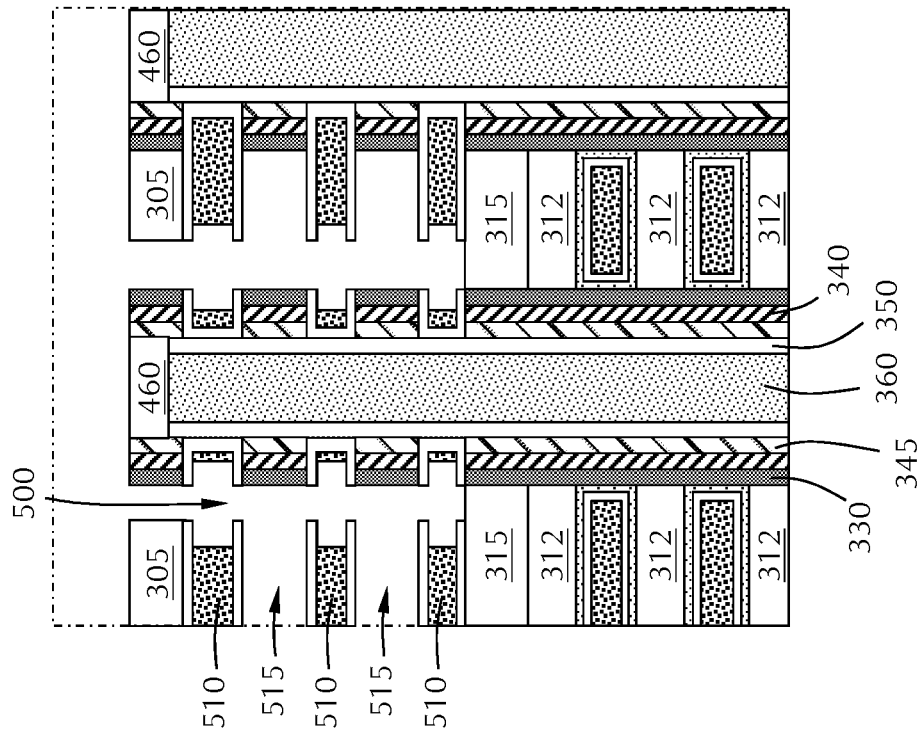

FIG. 21 shows the region of FIG. 20 after the conductive material 410 is recessed from the opening 500 created by the self-aligned etch process 236 to form recessed conductive material 510. The conductive material 410 can be recessed by any suitable process known to the skilled artisan.

Figure 22:
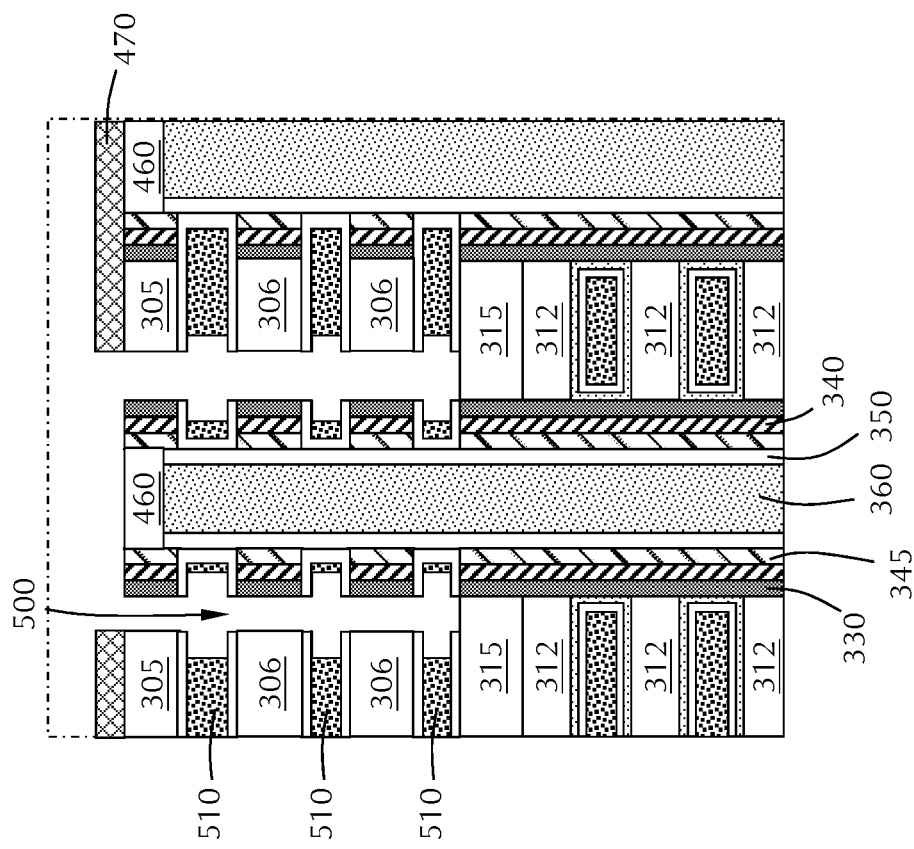

FIG. 22 shows the region of FIG. 21 after process 238 has been performed. In process 238, the silicon layers 306 are removed through the opening 500 left from the self-aligned etch process 236 to leave openings 515. The silicon layers 306 can be removed by any suitable technique known to the skilled artisan. In some embodiments, the silicon layers 306 are removed by a wet etch process. In some embodiments, the silicon layers 306 are removed by a dry etch process. In some embodiments, as illustrated, process 238 also removes any residual hardmask 470.

Figure 23:
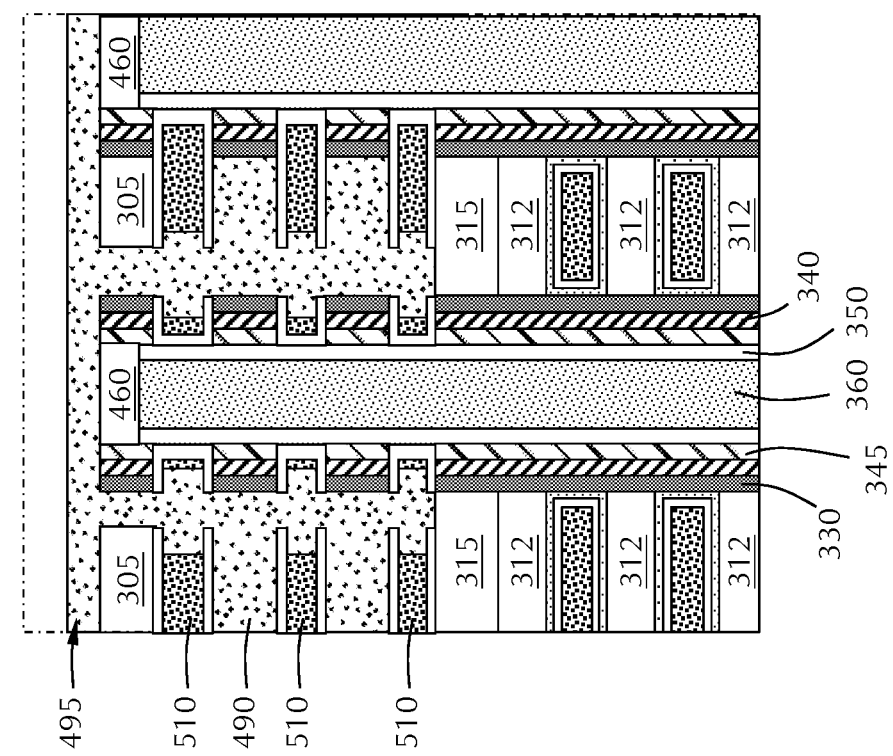

FIG. 23 shows the region of FIG. 22 after filling process 240 in which the opening 500 and openings 515 are filled with a dielectric material 490. The dielectric material 490 can be any suitable dielectric deposited by any suitable technique. In some embodiments, the dielectric material 490 comprises silicon dioxide. In some embodiments, the dielectric material 490 forms an overburden 495 on the top surface of the first layer stack 302 (or top surface of the cap layer) and the top surface of the aluminum oxide layer 460, as shown in FIG. 23.

Figure 24:
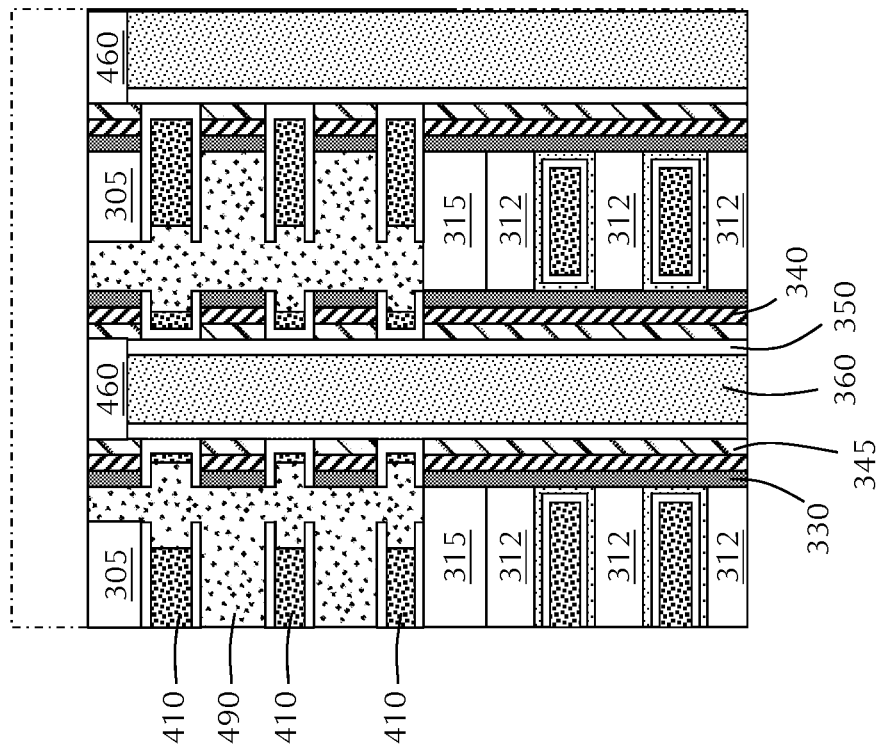

FIG. 24 shows the region of FIG. 23 after process 242 in which the overburden 495 is removed from the top surface. The overburden can be removed by any suitable technique known to the skilled artisan. In some embodiments, the overburden is removed by etching or CMP.

Figure 25:
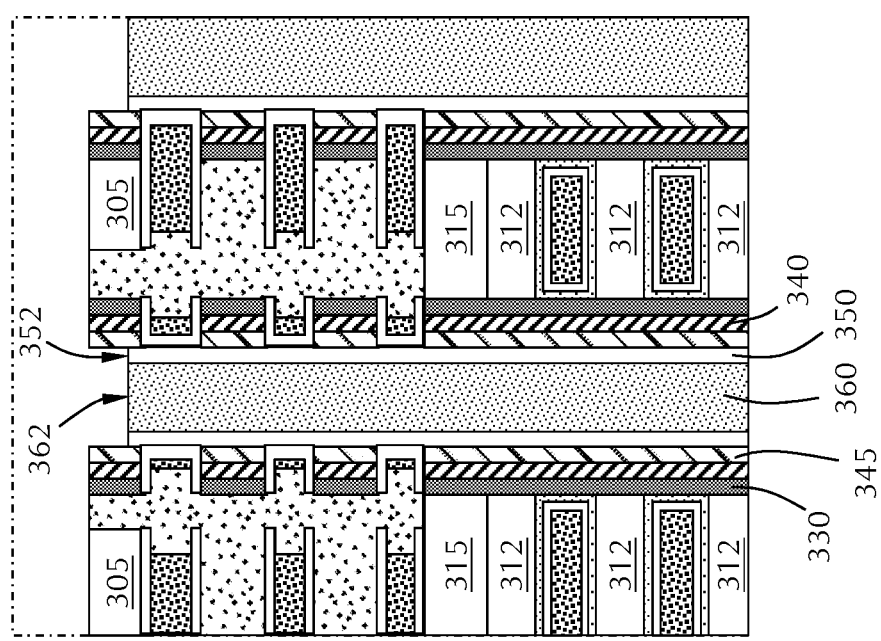

FIG. 25 shows the region of FIG. 24 after removal of the aluminum oxide layer 460. Removing the aluminum oxide layer 460 exposes the top surface 362 of the core oxide 360 and the top surface 352 of the semiconductor material 350. The aluminum oxide can be removed by any suitable technique known to the skilled artisan. In some embodiments, the aluminum oxide layer 460 is removed by a wet etch process. In some embodiments, the aluminum oxide layer 460 is removed by a dry etch process.

Figure 26:
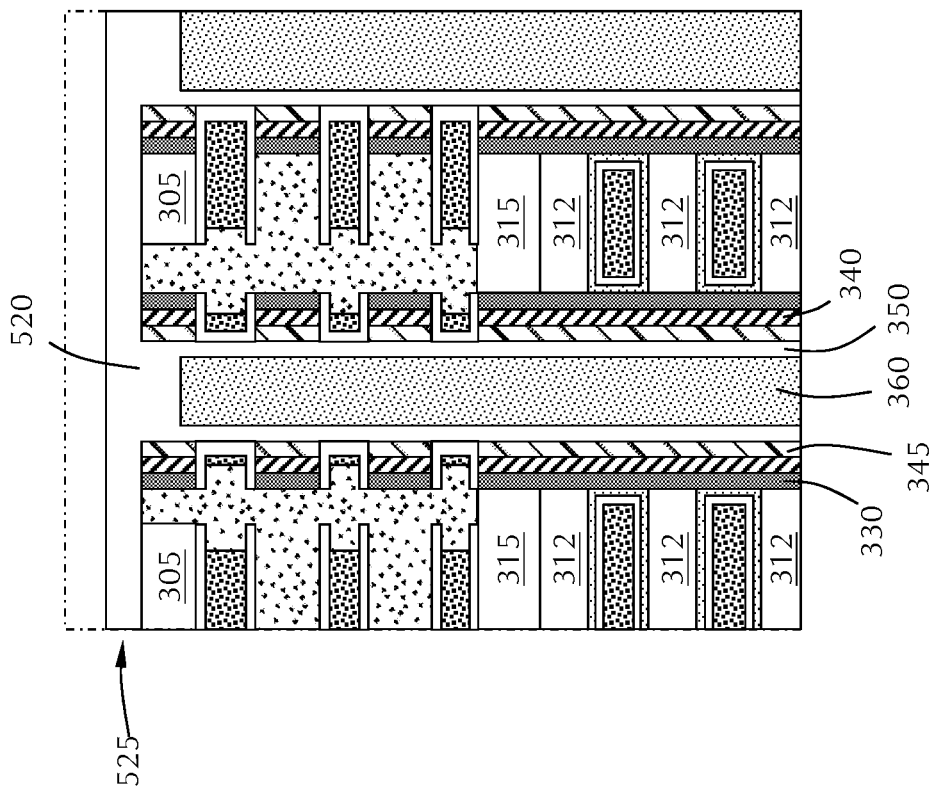

FIG. 26 shows the region of FIG. 25 after a semiconductor material 520 is deposited on the top surface 352 of the semiconductor material 250 and the top surface 263 of the core oxide 260 in the memory hole. In some embodiments, the semiconductor material 520 comprises the same material as semiconductor material 350. In some embodiments, the semiconductor material 520 comprises one or more of un-doped, n-doped or p-doped silicon.

Figure 27:
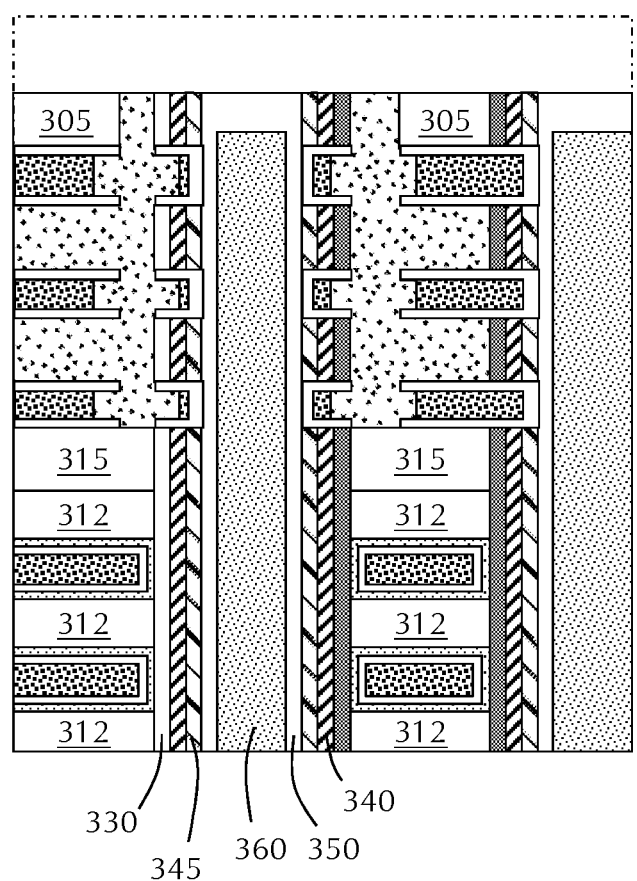

In some embodiments, as shown in FIG. 26, the semiconductor material 520 forms an overburden 525 on the top of the device. FIG. 27 shows the region of FIG. 26 after removal of the overburden 525. The overburden 525 can be removed by any suitable technique known to the skilled artisan. In some embodiments, the overburden is removed by CMP. In some embodiments, not shown, a dielectric material is deposited over the surface of the semiconductor material 520 after CMP of the overburden.

With reference to FIGS. 2 and 27, one or more embodiments of the disclosure are directed to electronic devices. The electronic device 100 includes a stack 130 of alternating silicon layers 132 and memory layers 134. Each of the silicon layers 132 and memory layers 134 lie within a plane defined by a first direction 101 and a second direction 102 with a thickness along a third direction 103.

A plurality of memory holes 110 extend along the third direction 103 through the thicknesses of at least some of the alternating silicon layers 132 and memory layers 134. Each of the memory holes has a core oxide 112 surrounded by a memory hole semiconductor material 114. The memory hole semiconductor material 114 is surrounded by a memory hole dielectric 116, 118. In some embodiments, the memory hole dielectric 116, 118 comprises a third layer. In some embodiments, the memory hole dielectric comprises a memory hole first oxide layer, and memory hole nitride layer and a memory hole second oxide layer, as described above.

The memory holes 110 are staggered to provide a plurality of memory hole lines 111 having spaced memory holes 110 along the first direction 101 so that adjacent memory hole lines 111 have the memory holes 110 in a staggered configuration. FIG. 2 illustrates the staggered configuration with multiple memory hole lines 111, with each memory hole line 111 having two memory holes 110. The number and staggering of the memory holes 110 illustrated is merely representative of possible arrangements and the skilled artisan will recognize that other arrangements are included within the scope of the disclosure.

A conductive material 410 on top of the plurality of alternating silicon layers 132 and memory layers 134 and surrounding each of the memory holes 110 so that a top portion of the memory holes 110 are exposed.

In some embodiments, a dielectric filled cut line 120 extends along the first direction 101 through the conductive material. The dielectric filled cut line 120 separates a first memory hole line 111*a* from an adjacent second memory hole line 111*b* without disabling the functionality of the memory holes 110.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. An electronic device comprising:
a stack of alternating silicon layers and memory layers, each layer lying within a plane defined by a first direction and a second direction and having a thickness along a third direction;
a plurality of memory holes extending along the third direction through the thicknesses of at least some of the alternating silicon layers and memory layers, each memory hole having a core oxide surrounded by a memory hole semiconductor material, the memory hole semiconductor material surrounded by a memory hole dielectric, the memory holes staggered to provide a plurality of memory hole lines having spaced memory holes along the first direction so that adjacent memory hole lines have the memory holes in a staggered configuration;
a conductive material on top of the stack of alternating silicon layers and memory layers and surrounding each of the memory holes so that a top portion of the memory holes are exposed; and
a dielectric filled cut line extending along the first direction through the conductive material, the dielectric filled cut line separating a first memory hole line from an adjacent second memory hole line without disabling the functionality of the memory holes, and the dielectric filled cut line positioned to cover a portion of memory holes from the first memory hole line and a portion of memory holes from the adjacent second memory hole line.

2. The electronic device of claim 1, wherein the dielectric filled cut line passes through an edge of the alternating memory holes in the first memory hole line and second memory hole line.

3. The electronic device of claim 1, wherein the silicon layers comprise polysilicon.

4. The electronic device of claim 1, wherein the memory layers comprise an aluminum oxide layer, a titanium nitride layer on the aluminum oxide layer and a tungsten fill.

5. The electronic device of claim 1, wherein the stack of alternating silicon layers and memory layers are on a stack of alternating oxide layers and nitride layers.

6. The electronic device of claim 5, wherein the dielectric filled cut line extends through the stack of alternating silicon layers and memory layers.

7. The electronic device of claim 1, wherein the memory hole dielectric comprises an inner layer and an outer layer, the inner layer comprising silicon nitride and the outer layer comprising titanium nitride.

8. The electronic device of claim 1, wherein the conductive material comprises tungsten.

9. The electronic device of claim 1, wherein the electronic device is a 3D NAND device.

10. A method of forming a memory device, the method comprising:
opening a plurality of memory holes in a stack of alternating silicon layers and nitride layers, the silicon layers and nitride layers lying along a plane formed by a first direction and a second direction with a thickness extending along a third direction, and the openings extending along the third direction;
filling the memory holes with a core oxide, a memory hole semiconductor material and a memory hole nitride layer;
forming a cut line along the first direction between adjacent memory hole rows the cut line positioned to cover a portion of the memory holes from a first memory hole line and a portion of memory holes from an adjacent second memory hole line; and
filling the cut line with a dielectric.

11. The method of claim 10, wherein the core oxide comprises silicon oxide and the memory hole nitride layer comprises one or more of silicon nitride or titanium nitride.

12. The method of claim 10, wherein the memory holes are formed by reactive ion etching (RIE).

13. The method of claim 10, wherein the plurality of memory holes are staggered to provide a plurality of memory hole lines having spaced memory holes along the first direction so that adjacent memory hole lines have the memory holes in a staggered configuration.

14. The method of claim 10, wherein the core oxide comprises silicon oxide.

15. The method of claim 10, wherein after filling the memory holes and before forming the cut line, the method further comprises:
forming one or more slits through the plurality of alternating silicon layers and nitride layers;
recessing the nitride layers through the slits to leave memory layer openings;
depositing an oxide layer within the memory layer openings; and
depositing a metal within the oxide layer within the memory layer openings.

16. The method of claim 10, wherein forming the cut line comprises forming a mask with a pattern to match the slit line location and etching through the mask to form the slit line.

17. The method of claim 10, wherein filling the cut line with a dielectric comprises forming an overburden on a top of the memory holes and removing the overburden by one or more of etching or chemical-mechanical planarization.

18. A method of forming a memory device, the method comprising:
opening a plurality of memory holes through a first layer stack on a second layer stack, the first layer stack comprising alternating silicon layers and nitride layers, the second layer stack comprising alternating oxide layers and nitride layers, each of the layers of the first layer stack and the second layer stack lying along a plane formed by a first direction and a second direction and having a thickness along a third direction, and the openings extend along the third direction, the plurality of memory holes are staggered to provide a plurality of memory hole lines having spaced memory holes along the first direction so that adjacent memory hole lines have the memory holes in a staggered configuration;
forming a conformal oxide layer on the first layer stack and sidewalls of the memory holes;
forming a conformal memory hole nitride layer on the conformal oxide layer;
forming a conformal semiconductor material layer on the conformal memory hole nitride layer;
filling the memory hole with a core oxide;
removing overburden material to expose a top surface of the core oxide and a top surface of the semiconductor material and the conformal memory hole nitride layer;

forming a slit extending along the first direction through at least the first layer stack, the slit having a width along the second direction and a depth along the third direction;

recessing the nitride layers of the first layer stack through the slit to leave memory layer gaps and expose first and second surfaces of the silicon layers;

forming an oxide layer in the memory layer gaps;

forming a barrier layer on the oxide layer in the memory layer gaps;

filling the memory layer gaps with a conductive material;

forming a cut line along the first direction between adjacent memory hole rows the cut line positioned to cover a portion of the memory holes from a first memory hole line and a portion of memory holes from an adjacent second memory hole line; and filling the cut line with a dielectric.

\* \* \* \* \*